United States Patent
Makino et al.

(10) Patent No.: US 6,566,239 B2
(45) Date of Patent: May 20, 2003

(54) SEMICONDUCTOR DEVICE MANUFACTURING METHOD HAVING A STEP OF FORMING A POST TERMINAL ON A WIRING BY ELECTROLESS PLATING

(75) Inventors: Yutaka Makino, Kawasaki (JP); Eiji Watanabe, Kawasaki (JP); Hirohisa Matsuki, Kawasaki (JP); Tetsuya Fujisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/867,545

(22) Filed: May 31, 2001

(65) Prior Publication Data

US 2002/0076908 A1 Jun. 20, 2002

(30) Foreign Application Priority Data

Dec. 19, 2000 (JP) ........................................ 2000-386033

(51) Int. Cl.⁷ .............................................. H01L 21/44
(52) U.S. Cl. ..................... 438/612; 438/597; 438/614
(58) Field of Search ................................ 438/597, 612, 438/613, 614

(56) References Cited

U.S. PATENT DOCUMENTS 6,181,569 B1 * 1/2001 Chakravorty ................ 361/761
6,297,553 B1 * 10/2001 Horiuchi et al. ............. 257/737
6,362,099 B1 * 3/2002 Gandikota et al. .......... 438/687

FOREIGN PATENT DOCUMENTS

| JP | 2000-183090 | 6/2000 |
|----|-------------|--------|
| WO | WO98/02919  | 1/1998 |

\* cited by examiner

*Primary Examiner*—Kamand Cuneo
*Assistant Examiner*—Asok Kumar Sarkar
(74) *Attorney, Agent, or Firm*—Armstrong, Westerman & Hattori, LLP

(57) ABSTRACT

A method of manufacturing a semiconductor device is provided. The method includes the steps of forming a wiring layer on an underlying metal film formed on a substrate, the wiring layer being electrically connected to an electrode pad formed on a substrate, removing a part of the wiring layer so as to form a wiring on the substrate, a part of the underlying metal film being exposed other than a part where the wiring is formed, removing the exposed part of the underlying metal film by using the wiring as a mask, forming a barrier metal film on the wiring so as to cover the wiring and the underlying metal film underneath the wiring, forming a post terminal by electroless plating so that the post terminal is electrically connected to said wiring and providing a sealing resin so as to cover said substrate except a position at which said post terminal is formed.

6 Claims, 12 Drawing Sheets

SEMICONDUCTOR DEVICE MANUFACTURING METHOD HAVING A STEP OF FORMING A POST TERMINAL ON A WIRING BY ELECTROLESS PLATING

BACKGROUND OF THE INVENTION

1. Field of the Invention

The present invention generally relates to a method of manufacturing a semiconductor device and, more particularly, to a method of manufacturing a semiconductor device having a post electrode as a mounting terminal.

Recently, as a semiconductor device has rapidly been miniaturized and given a higher density, mounting terminals thereof accordingly have been pitched narrowly. Especially for a CSP (Chip Size Package), the above-mentioned narrow pitch makes a serious problem when the CSP has mounting terminals provided on electrode pads formed on the periphery of a semiconductor element, because the semiconductor element has substantially the same size as the package itself.

In order to avoid the above-mentioned problem, mounting terminals and electrode pads are formed in an offset state so that the mounting terminals are formed in a matrix in a package. This structure requires wirings (hereinafter referred to as redistribution layers) to connect the mounting terminals and the electrode pads.

On the other hand, a semiconductor device is required to be manufactured at a low cost. Accordingly, in manufacturing a semiconductor device, the above-mentioned redistribution layers need to be formed at a low cost.

2. Description of the Related Art

Recently, wafer-level techniques have been applied in manufacturing a CSP-type semiconductor device, in which techniques redistribution layers (wirings) and a sealing resin are provided before dicing (separating into pieces) a wafer. Hereinbelow, a description will be given of a conventional method of forming a redistribution layer (a wiring) and providing a sealing resin at the wafer level.

FIG. 1 to FIG. 12 show a series of steps of manufacturing a conventional semiconductor device. As mentioned above, a wiring (a redistribution layer) 25 and a sealing resin 26 are provided before dicing (separating into pieces) a wafer 11. However, for convenience' sake in showing and describing, FIG. 1 to FIG. 12 do not show the whole wafer 11, but magnify a part of the wafer 11 in the vicinity of an electrode pad 12.

Figure 1:
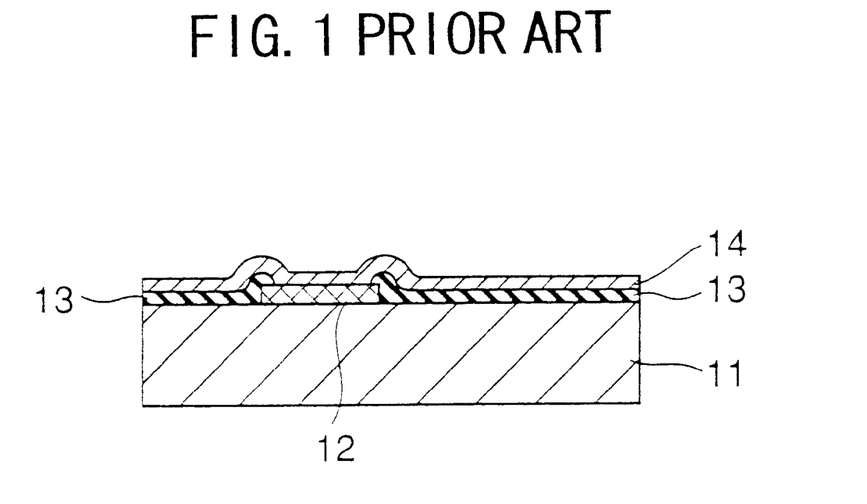
FIG. 1 is a first illustration for explaining a method of forming a conventional redistribution layer (a wiring)

An electronic circuit and an electrode pad 12 are formed beforehand on the upper surface of the wafer 11 (a surface on which the wiring 25 is to be formed). Also an insulating film 13 is formed so as to cover the upper surface of the wafer 11. The insulating film 13 has an opening formed at a position corresponding to the electrode pad 12 so that the electrode pad 12 is exposed from the insulating film 13.

In forming the wiring 25, firstly, an underlying metal film 14 is formed on the wafer 11 in the above-mentioned state, as shown in FIG. 1. The underlying metal film 14 is made of copper (Cu), and is formed by sputtering. The underlying metal film 14 is formed all over the wafer 11.

Figure 2:
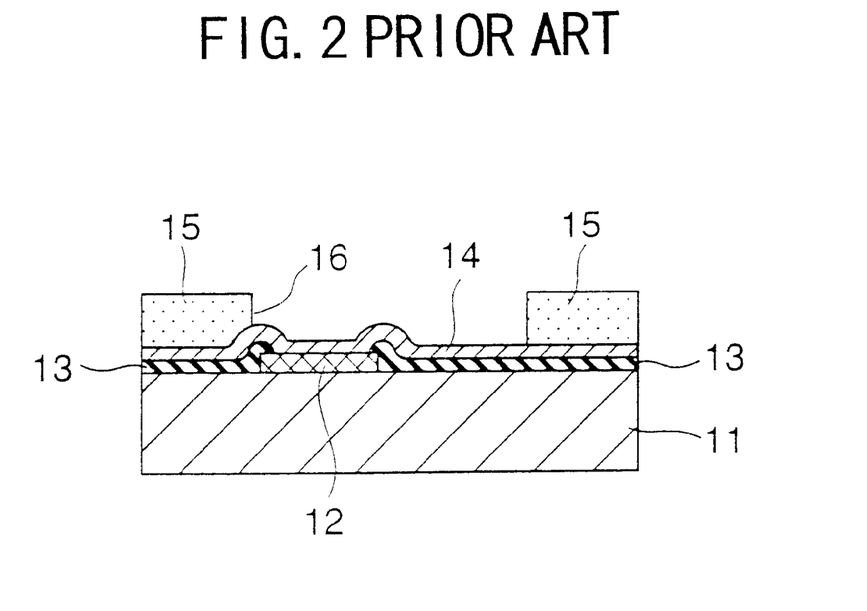
FIG. 2 is a second illustration for explaining the method of forming the conventional wiring.
Figure 3:
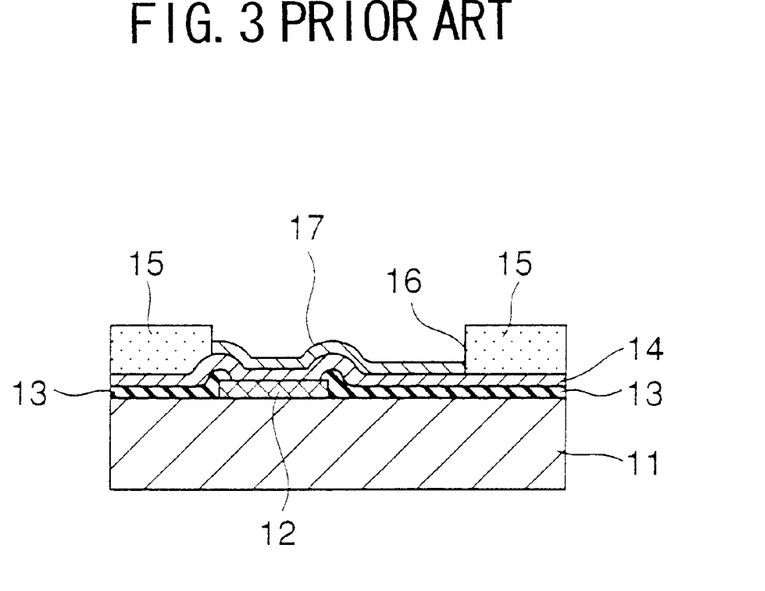
FIG. 3 is a third illustration for explaining the method of forming the conventional wiring.

After the underlying metal film 14 is formed, a resist 15 made of an insulating material is provided on the underlying metal film 14, as shown in FIG. 2. The resist 15 has an opening 16 shaped according to the wiring 25 to be formed. Subsequently, a wiring film 17 is formed on the underlying metal film 14, as shown in FIG. 3, by electroplating using the underlying metal film 14 as an electrode and the resist 15 as a mask.

This wiring film 17 is made also of copper (Cu) as the underlying metal film 14. In the above-mentioned electroplating, the resist 15 is used as the mask so as to give the wiring film 17 a shape according to the wiring 25 to be formed.

Figure 4:
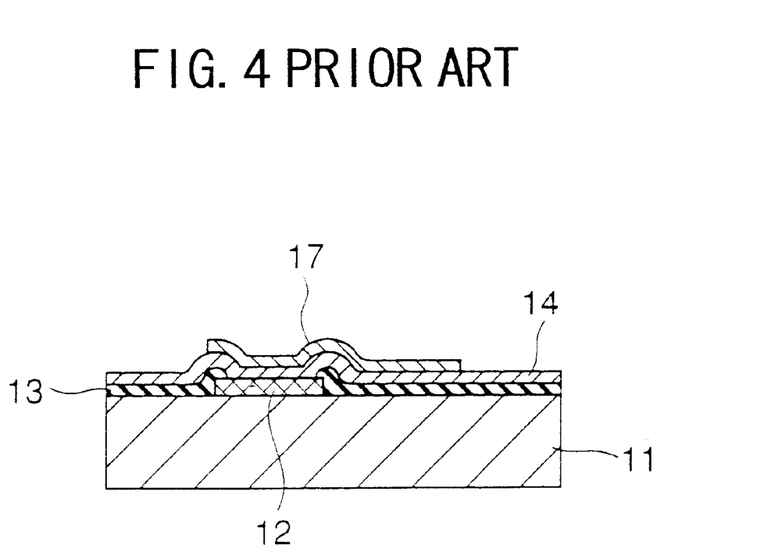
FIG. 4 is a fourth illustration for explaining the method of forming the conventional wiring.
Figure 5:
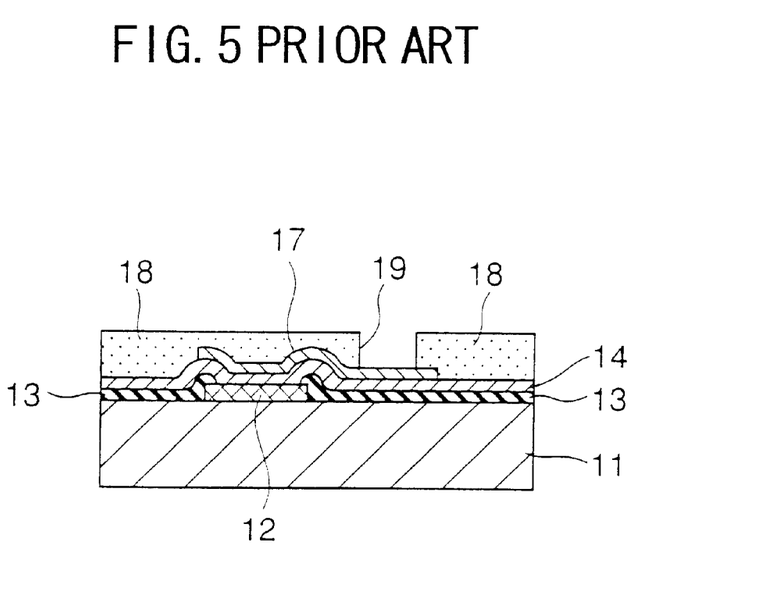
FIG. 5 is a fifth illustration for explaining the method of forming the conventional wiring.

After the wiring film 17 is formed, the resist 15 is removed, as shown in FIG. 4. Thereafter, a resist 18 is provided on the underlying metal film 14 and the wiring film 17, as shown in FIG. 5. The resist 18 has an opening 19 to form a post 20 therein.

Figure 6:
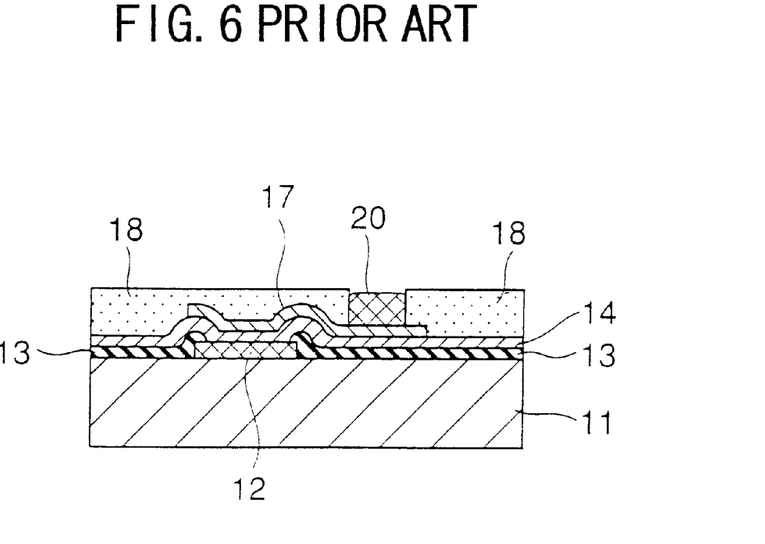
FIG. 6 is a sixth illustration for explaining the method of forming the conventional wiring.

Subsequently, the post 20 is formed in the opening 19, as shown in FIG. 6, by electroplating using the underlying metal film 14 as an electrode and the resist 18 as a mask. This post 20 is made also of copper (Cu) as the underlying metal film 14 and the wiring film 17. The post 20 is formed at a position corresponding to a position at which a solder bump 27 (a mounting terminal) is to be provided in a step described hereinafter.

Figure 7:
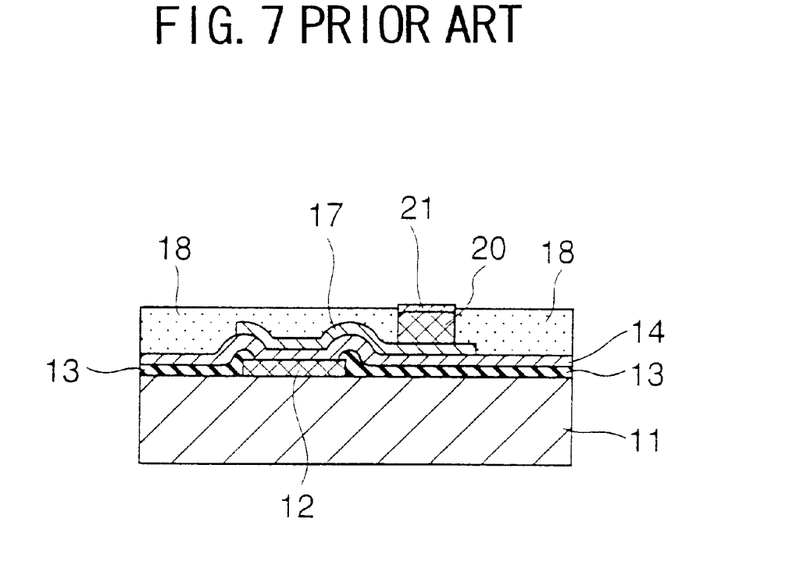
FIG. 7 is a seventh illustration for explaining the method of forming the conventional wiring.
Figure 8:
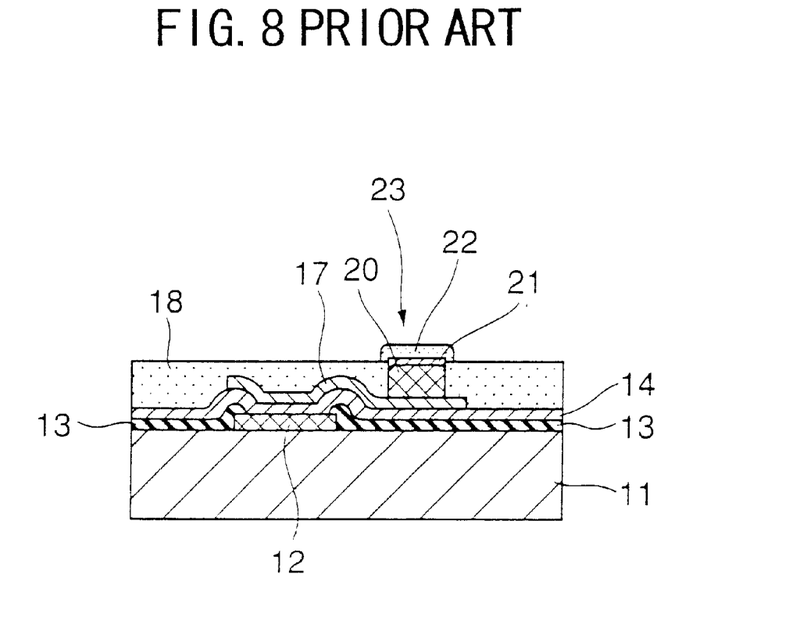
FIG. 8 is an eighth illustration for explaining the method of forming the conventional wiring.

After the post 20 is formed, an Ni film 21 is formed on the post 20, as shown in FIG. 7. Subsequently, an Au film 22 is formed on the Ni film 21, as shown in FIG. 8, so that the post 20, the Ni film 21 and the Au film 22 together form a post terminal 23.

Figure 9:
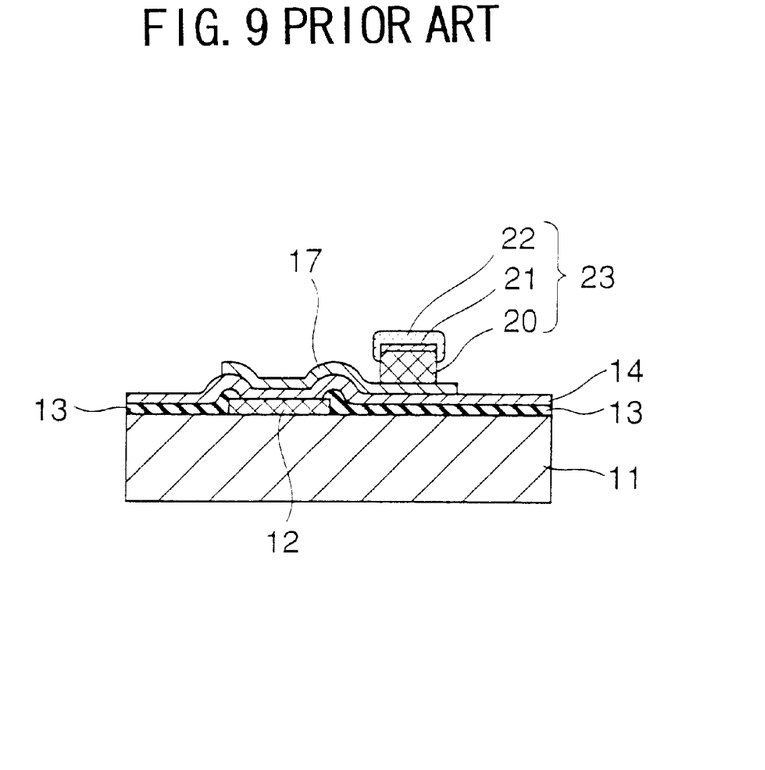
FIG. 9 is a ninth illustration for explaining the method of forming the conventional wiring.
Figure 10:
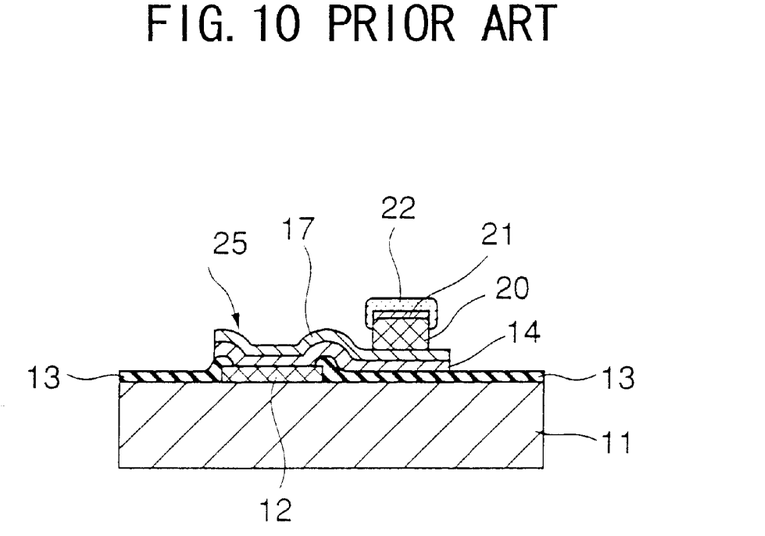
FIG. 10 is a tenth illustration for explaining the method of forming the conventional wiring.

After the post terminal 23 is formed, the resist 18 is removed, as shown in FIG. 9. Thereafter, a resist (not shown in the figures) is provided so as to cover the wiring film 17 (having the shape according to the wiring 25 to be formed) and the post terminal 23 for a patterning of the underlying metal film 14. Specifically, the underlying metal film 14 except a portion facing the wiring film 17 (having the shape according to the wiring 25 to be formed) is removed by etching, as shown in FIG. 10. This forms the wiring 25 on the wafer 11.

Figure 11:
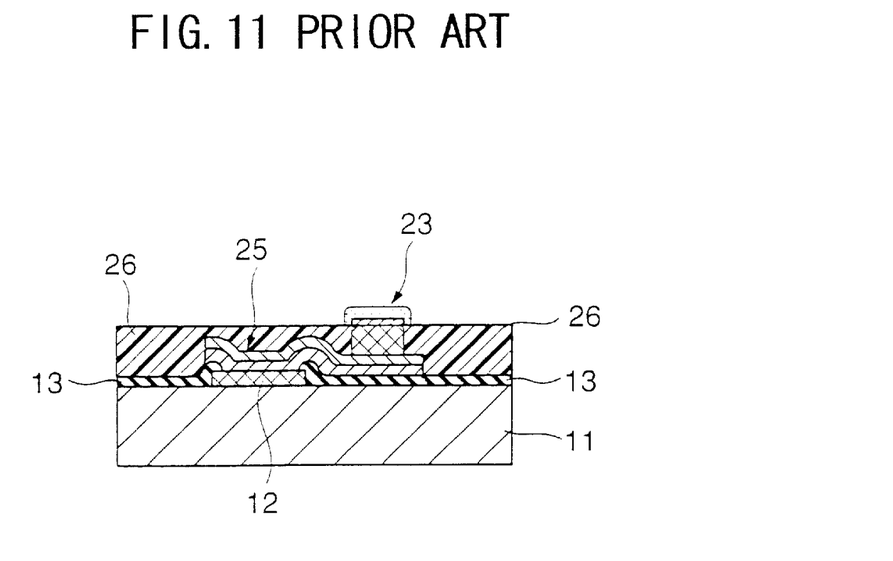
FIG. 11 is an eleventh illustration for explaining the method of forming the conventional wiring.
Figure 12:
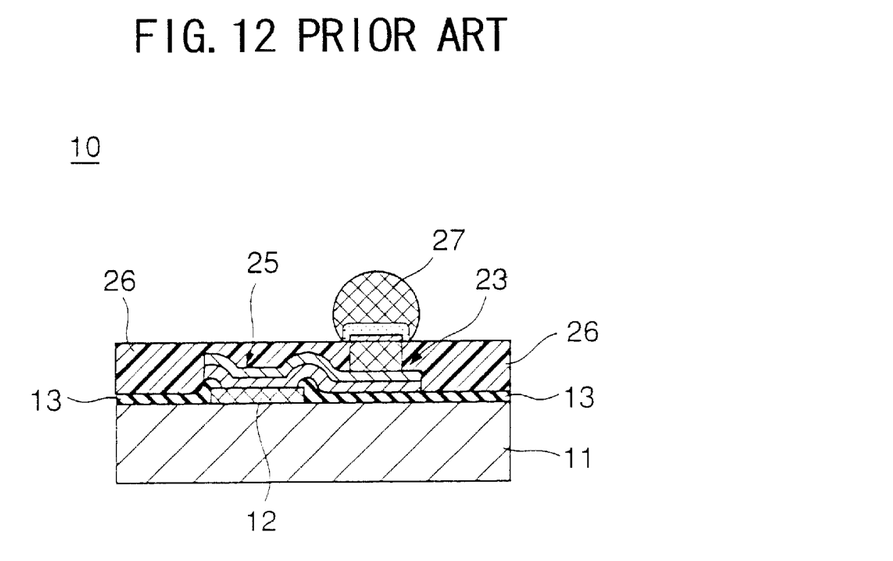
FIG. 12 is a twelfth illustration for explaining the method of forming the conventional wiring.

After the post terminal 23 and the wiring 25 are formed as above, the sealing resin 26 is formed over the wafer 11 by molding, as shown in FIG. 11. Then, the solder bump 27 as a mounting terminal is provided on the upper end of the post terminal 23 by, for example, a transferring process. Thereafter, the wafer 11 is diced into pieces so as to form a semiconductor device 10. FIG. 12 shows a part of the completed semiconductor device 10 in the vicinity of the electrode pad 12.

As described above, the wiring 25 and the post terminal 23 are formed by electroplating steps (see FIG. 3 and FIG. 6). However, using the electroplating steps to form the wiring 25 and the post terminal 23 necessitates an electric supply to be provided to a portion plated by a metal (copper in the above-mentioned steps) in electroplating.

The underlying metal film 14 shown in FIG. 1 is used to provide the above-mentioned electric supply in electroplating. Therefore, the underlying metal film 14 cannot be removed until all electroplating steps are finished. In other words, the underlying metal film 14 is removed after all the electroplating steps are finished. Specifically, in the above-described conventional method, the underlying metal film 14 is removed by etching shown in FIG. 10.

Therefore, until the underlying metal film 14 is removed, the sealing resin 26 cannot be provided. Accordingly, in forming metal members including the wiring film 17 and the post 20, a resist has to be provided and then removed each time. This complicates the manufacturing steps of a semiconductor device.

Specifically, in the conventional method shown in FIG. 1 to FIG. 12, the wiring 25 and the post terminal 23 need to be formed prior to the step of removing the underlying metal film 14 shown in FIG. 10. Accordingly, the resist 15 has to be provided in the step shown in FIG. 2 so as to form the wiring 25 (the wiring film 17), and then the resist 15 has to be removed in the step shown in FIG. 4. Also, the resist 18 has to be provided in the step shown in FIG. 5 so as to form the post terminal 23, and then the resist 18 has to be removed in the step shown in FIG. 9. Thus, the above-described conventional method requires two sets of steps of providing and removing a resist. This complicates the manufacturing steps of a semiconductor device.

Besides, using a copper (Cu) as a material forming the wiring 25 (the wiring film 17) entails a consideration for a migration. That is, although a copper (Cu) has a small electrical resistance, and thus has a good electric property as a wire, the copper (Cu) is prone to be affected by a migration so that arranging copper wires (the wiring 25) adjacent to each other causes a poor insulation. It is well known that coating the copper wire (the wiring 25) with another metal film such as a nickel (Ni) film effectively prevents this migration.

Considering when to perform such a coating step so as to coat the wiring 25 completely, forming the metal film before removing the underlying metal film 14 is too early, because the remaining portion of the underlying metal film 14 is exposed from the metal film when the underlying metal film 14 except the portion facing the wiring 25 (the wiring film 17) is removed. Therefore, the metal film needs to be formed to completely coat the wiring 25 after removing the underlying metal film 14. On the other hand, it is impossible to coat the wiring 25 with the metal film after the sealing resin 26 is provided. Consequently, in the above-described conventional method, the metal film for preventing a migration can only be formed in the step shown in FIG. 10.

However, if the metal film is formed in the step shown in FIG. 10, not only the wiring 25 but also the post terminal 23 are coated with the metal film. When the post terminal 23 is coated with the metal film such as a nickel (Ni) film, the solder bump 27 cannot surely be provided on the upper end of the post terminal 23 by a transferring process with a sufficient mounting intensity. This decreases the reliability of the semiconductor device 10. In short, the conventional manufacturing method does not provide an optimal opportunity to form the metal film for preventing a migration.

SUMMARY OF THE INVENTION

It is a general object of the present invention to provide an improved and useful method of manufacturing a semiconductor device having a post electrode as a mounting terminal in which method and device the above-mentioned problems are eliminated.

A more specific object of the present invention is to provide a method of manufacturing a semiconductor device having a post electrode as a mounting terminal which method can have simplified steps manufacturing the semiconductor device preventing a migration from occurring between wires thereof.

In order to achieve the above-mentioned objects, there is provided according to one aspect of the present invention a method of manufacturing a semiconductor device, the method comprising the steps of:

forming a wiring electrically connected to an electrode pad formed on a substrate, the wiring extending on the substrate;

forming a post terminal by electroless plating so that the post terminal is electrically connected to the wiring; and providing a sealing resin so as to cover the substrate except a position at which the post terminal is formed.

According to the present invention, since the post terminal is formed by electroless plating, an underlying metal film or an underlying wiring, which would be necessary in electroplating to provide an electric supply, does not have to be provided nor removed. This simplifies the steps of manufacturing a semiconductor device.

Additionally, in the semiconductor device manufacturing method according to the present invention, the step of providing the sealing resin may be performed before the step of forming the post terminal, and the step of providing the sealing resin may include forming an opening in the sealing resin so as to form the post terminal in the opening in the step of forming the post terminal.

According to the present invention, the post terminal can be formed by electroless plating using the sealing resin as a mask. Additionally, after the post terminal is formed by electroless plating, the sealing resin does not have to be removed to remove an underlying metal film or an underlying wiring that would be present under the sealing resin in electroplating to provide an electric supply. Therefore, the step of forming the post terminal does not need to include providing and removing a resist required in a conventional method. This simplifies the steps of manufacturing a semiconductor device.

Additionally, in the semiconductor device manufacturing method according to the present invention, the step of providing the sealing resin may include selecting an alkali-proof material to form the sealing resin.

According to the present invention, although an electroless plating solution used in electroless plating generally has a strong alkalinity, selecting an alkali-proof material to form the sealing resin prevents the sealing resin from deteriorating in electroless plating. Thus, the post terminal can surely be formed by electroless plating using the sealing resin as a mask.

Additionally, the semiconductor device manufacturing method according to the present invention may further comprise the step of forming a metal film on the wiring after the step of forming the wiring so that the wiring is coated with the metal film, wherein the step of forming the post terminal and the step of providing the sealing resin are performed after the step of forming the metal film.

According to the present invention, since the metal film is formed on the wiring after completion of the step of forming the wiring, the wiring is completely coated with the metal film without any portion of the wiring being exposed outwardly. Thereby, even though the wiring is made of a material disposed to a migration, the wiring is completely covered with the metal film so as to avoid a migration.

Additionally, in the semiconductor device manufacturing method according to the present invention, the wiring may be formed of copper (Cu).

According to the present invention, a copper (Cu), which has a small electrical resistance and thus has a good electric property as a wire, can improve the capability of the semiconductor device. It is noted that, even though the copper (Cu) itself is prone to cause a migration, the wiring formed of copper (Cu) is completely covered with the metal film so as to avoid a migration.

Additionally, the semiconductor device manufacturing method according to the present invention may further comprise the step of forming at least one metal film on the post terminal by electroless plating after the step of forming the post terminal.

According to the present invention, the metal film for the post terminal can be formed by electroless plating without using an underlying metal film or an underlying wiring to provide an electric supply, as in forming the post terminal. In addition, the metal film for the post terminal can be formed after the sealing resin is provided, because forming the metal film on the post terminal does not use the underlying metal film or the underlying wiring to provide an electric supply.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

FIG. 15 to FIG. 24 show a method of manufacturing a semiconductor device according to an embodiment of the present invention. It is noted that the method of manufacturing the semiconductor device according to the present embodiment is characterized by steps of forming a wiring (a redistribution layer) 55, a post terminal 54 and a sealing resin 48, and that other manufacturing steps are well known. Therefore, the following description will be given mainly of the above-mentioned steps characterizing the present invention.

The wiring 55, the post terminal 54 and the sealing resin 48 are formed before dicing (separating into pieces) a wafer 41. However, for convenience' sake in showing and describing, FIG. 15 to FIG. 24 show magnified views of the vicinity of an electrode pad 42 of a semiconductor element formed in the wafer 41.

Figure 13:
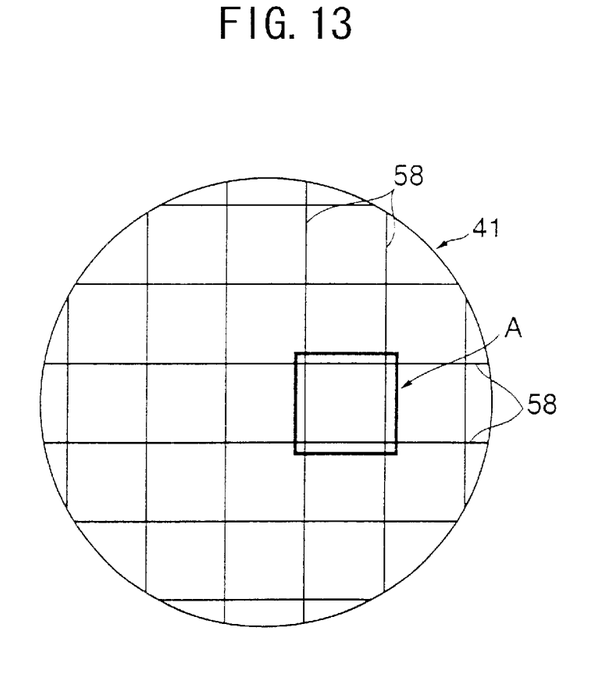
FIG. 13 is a plan view of a wafer to which a method of manufacturing a semiconductor device according to an embodiment of the present invention is performed.
Figure 14:
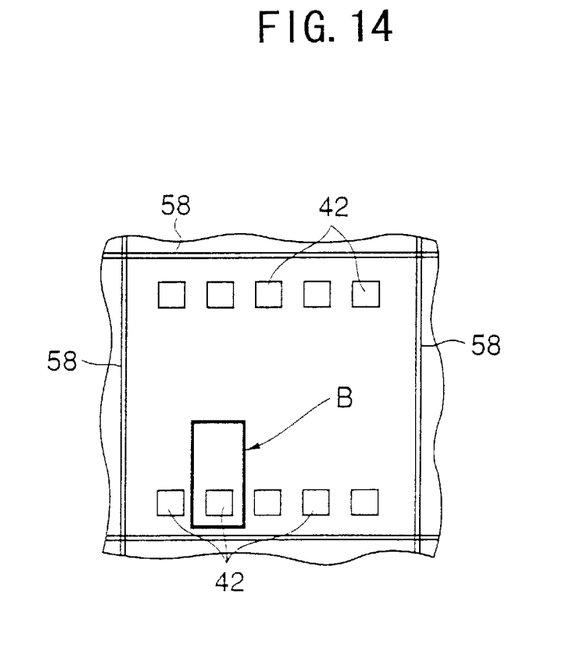
FIG. 14 is a magnified view of a portion pointed by an arrow A shown in FIG. 13.

Specifically, in the wafer 41 shown in FIG. 13, a portion defined by a solid-lined square (a portion pointed by an arrow A) is an area where the semiconductor element is formed. FIG. 14 is a magnification of the portion pointed by the arrow A in FIG. 13. FIG. 15 to FIG. 24 are cross-sectional views magnifying a portion in the vicinity of the electrode pad 42 shown in FIG. 14 (i.e., a portion defined by a solid-lined square pointed by an arrow B). Additionally, FIG. 13 and FIG. 14 show dicing lines 58.

An electronic circuit and the electrode pad 42 are formed beforehand on the upper surface of the wafer 41 (a surface on which the wiring 55 is to be formed). Also an insulating film 43 is formed so as to cover the upper surface of the wafer 41. The insulating film 43 may be a nitride film such as a passivation film or a resinous film such as a polyimide film. When the polyimide film is selected as the insulating film 43, the polyimide film is preferred to have a thickness of 2 $\mu$m to 50 $\mu$m. The insulating film 43 has an opening formed at a position corresponding to the electrode pad 42 so that the electrode pad 42 is exposed from the insulating film 43.

Figure 15:
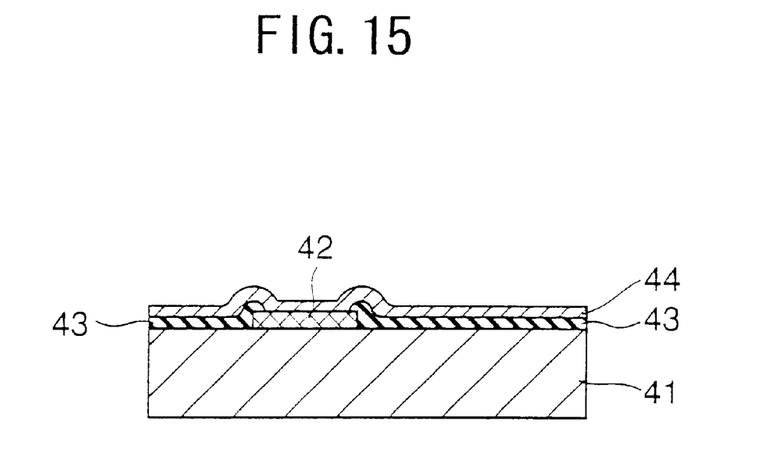
FIG. 15 is a first illustration for explaining a method of forming a redistribution layer (a wiring) according to the embodiment of the present invention.

In forming the wiring 55, firstly, an underlying metal film 44 is formed on the wafer 41 in the above-mentioned state by sputtering, as shown in FIG. 15. The underlying metal film 44 is made of copper (Cu), and is 200 nm to 800 nm thick. The underlying metal film 44 is electrically connected to the electrode pad 42.

Figure 16:
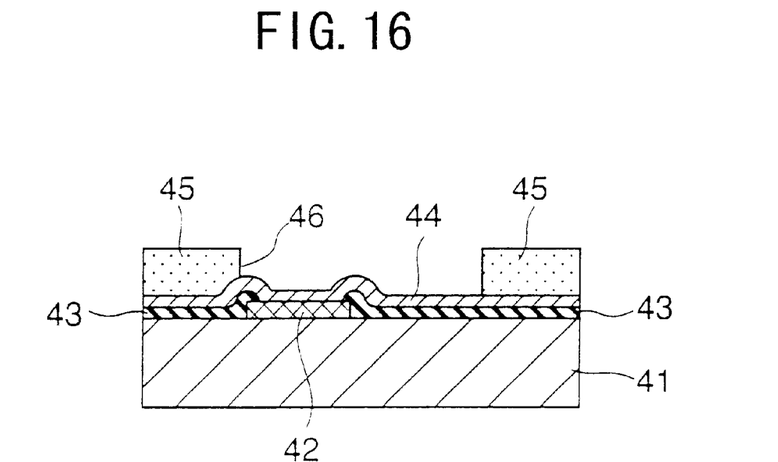
FIG. 16 is a second illustration for explaining the method of forming the wiring according to the embodiment of the present invention.

After the underlying metal film 44 is formed, a resist 45 made of an insulating material is provided on the underlying metal film 44, as shown in FIG. 16. The resist 45 has an opening 46 shaped according to the wiring 55 to be formed.

Figure 17:
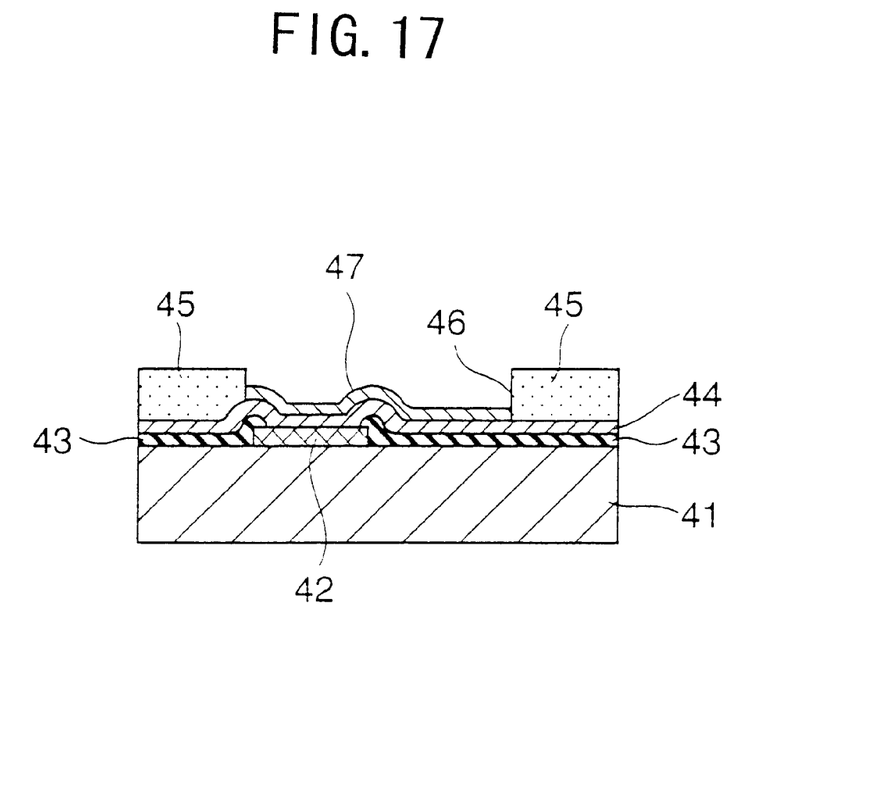
FIG. 17 is a third illustration for explaining the method of forming the wiring according to the embodiment of the present invention.

Subsequently, a wiring film 47 is formed on the underlying metal film 44, as shown in FIG. 17, by electroplating using the underlying metal film 44 as an electrode and the resist 45 as a mask. This wiring film 47 is made also of copper (Cu) as the underlying metal film 44, and has a thickness of 5 $\mu$m to 15 $\mu$m. In the above-mentioned electroplating, the resist 45 is used as the mask so as to give the wiring film 47 a shape according to the wiring 55 to be formed.

Figure 18:
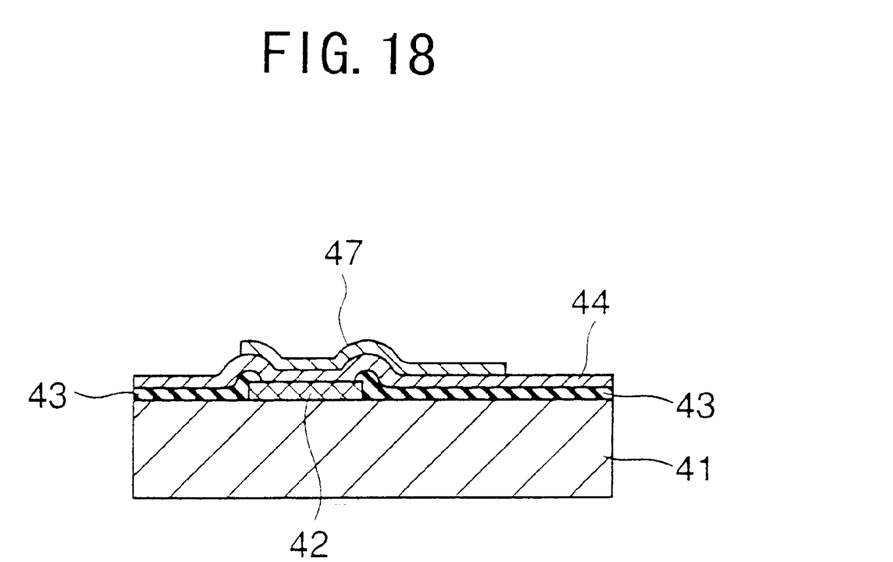
FIG. 18 is a fourth illustration for explaining the method of forming the wiring according to the embodiment of the present invention.

After the wiring film 47 is formed as above, the resist 45 is removed, as shown in FIG. 18. Thereafter, the underlying metal film 44 except a portion facing the wiring film 47 is removed by etching, using the wiring film 47 as a mask. After this removing step, an electroplating process using the underlying metal film 44 as an electrode cannot be performed because the underlying metal film 44 is removed.

In this step of removing the underlying metal film 44 by etching, the wiring film 47 used as the mask is also partially etched. However, the wiring film 47 has the large thickness of 5 μm to 15 μm, compared to the underlying metal film 44 having the extremely small thickness of 200 nm to 800 nm. Therefore, although the wiring film 47 is partially etched in removing the underlying metal film 44 by etching, the wiring film 47 maintains an enough thickness to function as the wiring 55. The heretofore-mentioned series of the steps forms the wiring 55 comprising the underlying metal film 44 and the wiring film 47.

After the wiring 55 is formed as described above, a first Ni film 51 is formed on the upper surface of the wiring 55 by electroless plating. In this step, since the underlying metal film 44 is already patterned into a shape according to the wiring 55 by the above-described step of removing the underlying metal film 44 by etching, the wiring 55 is completely coated with the first Ni film 51.

Figure 19:
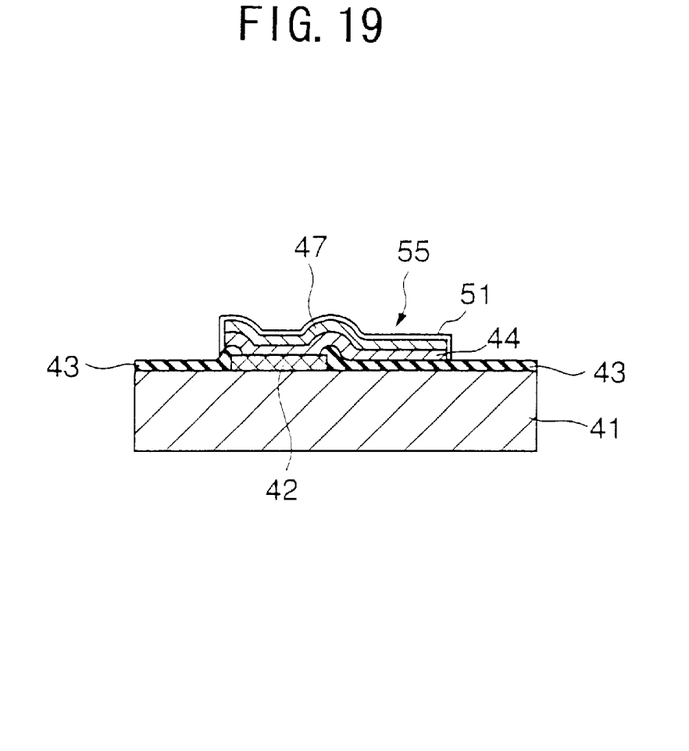
FIG. 19 is a fifth illustration for explaining the method of forming the wiring according to the embodiment of the present invention.

In other words, in the present embodiment, since the first Ni film 51 is formed after the above-mentioned series of the steps forming the wiring 55, the wiring 55 is completely coated with the first Ni film 51 without any portion of the wiring 55 being exposed outwardly. Thereby, even though the wiring 55 (the underlying metal film 44 and the wiring film 47) is made of copper (Cu) disposed to a migration, the wiring 55 is completely covered with the first Ni film 51 so as to avoid a migration. FIG. 19 shows the wiring 55 and the first Ni film 51 formed thereon.

Figure 20:
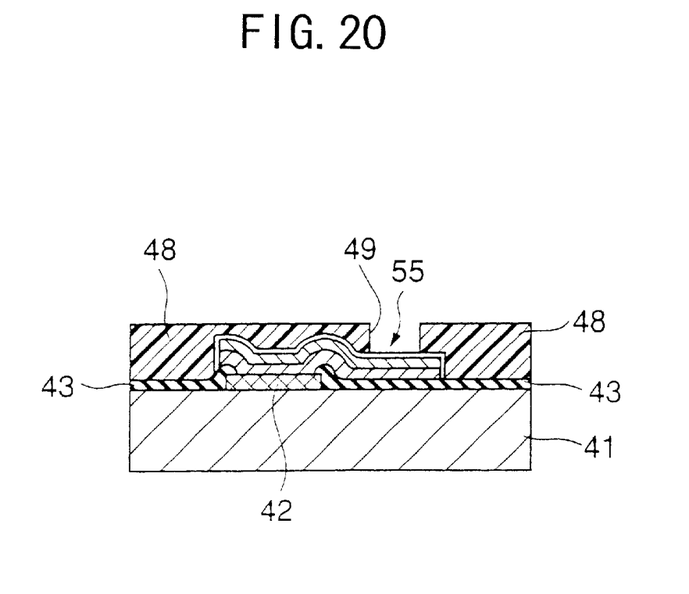
FIG. 20 is a sixth illustration for explaining the method of forming the wiring according to the embodiment of the present invention.

After the wiring 55 is coated with the first Ni film 51 as described above, the sealing resin 48 is provided over the wafer 41, as shown in FIG. 20. The sealing resin 48 is formed of an alkali-proof and insulating polyimide resin, for example, and is formed by compression molding. Additionally, the sealing resin 48 has an opening 49 formed at a position at which the post terminal 54 is to be formed.

This step of providing the sealing resin 48 is performed before the post terminal 54 is formed in the following steps. As described above, in the manufacturing method according to the present embodiment, since the wiring 55 is completed before the step shown in FIG. 19, the wiring 55 (the underlying metal film 44 and the wiring film 47) undergoes no further processing steps hereafter.

Figure 24:
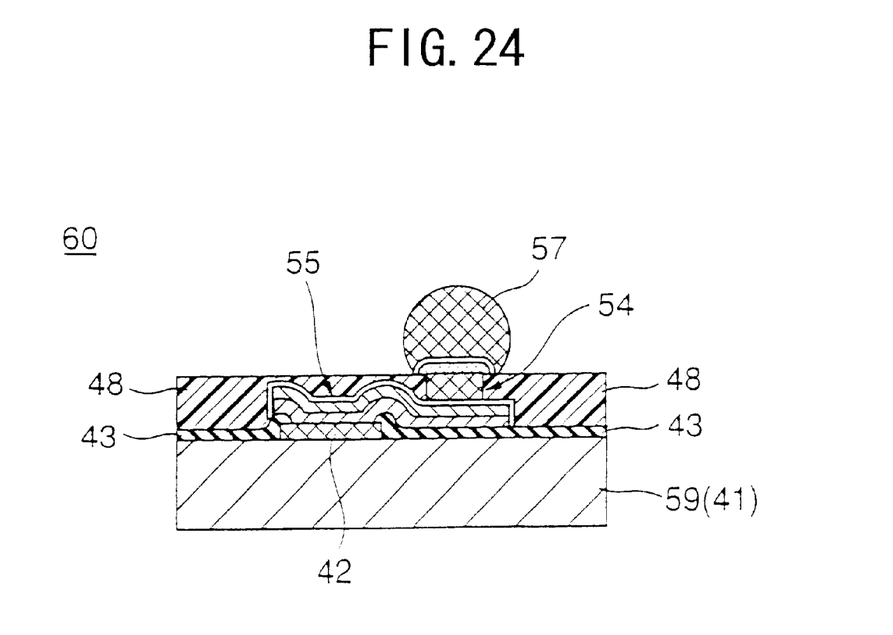
FIG. 24 is a tenth illustration for explaining the method of forming the wiring according to the embodiment of the present invention.

Therefore, the sealing resin 48 provided in the above-mentioned step does not have to be removed in the following steps, and thus can be made of a material in the final form as a part of a semiconductor device 60 (see FIG. 24). In other words, the sealing resin 48 provided in the above-mentioned step functions as a resinous package of the semiconductor device 60. The sealing resin 48 has a thickness ranging from 2 μm to 100 μm (preferably from 5 μm to 10 μm).

Figure 21:
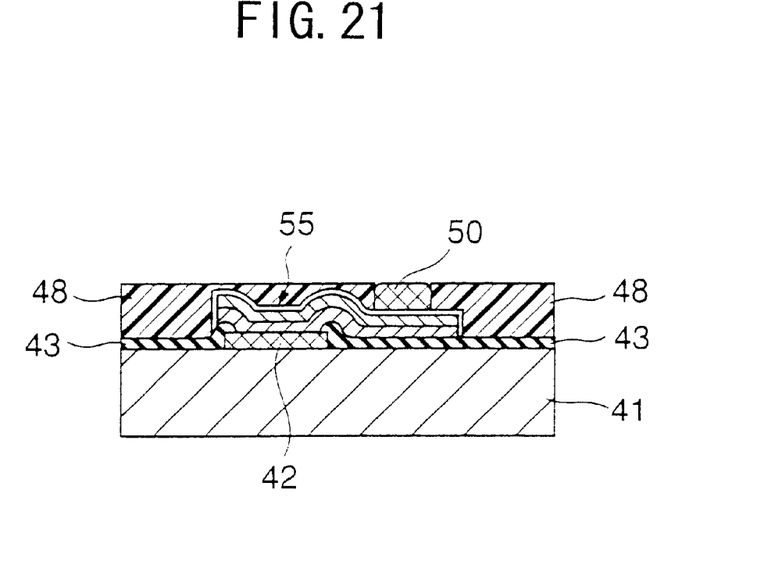
FIG. 21 is a seventh illustration for explaining the method of forming the wiring according to the embodiment of the present invention.

After the sealing resin 48 is provided as described, a post 50 is formed in the opening 49. The post 50 is made of copper (Cu), and is formed by electroless plating. Specifically, the post 50 can be formed by electroless plating using a commercial electroless copper plating solution (Melplate Cu-100 manufactured by Meltex Inc.). The post 50 has a height ranging within ±3 μm from the thickness of the sealing resin 48. FIG. 21 shows the post 50 formed in the opening 49 of the sealing resin 48 by electroless plating.

In this way, by using electroless plating, the post 50 can be formed on the wiring 55 even after the underlying metal film 44 necessary for an electric supply is removed and the sealing resin 48 functioning as the resinous package is provided. Additionally, since the sealing resin 48 forming a part of the semiconductor device 60 is used as a mask to form the post 50, the steps of providing and removing the resist 18 shown in FIG. 5 and FIG. 9 required to form the post 20 do not have to be performed so as to simplify the manufacturing steps of the semiconductor device 60.

Figure 22:
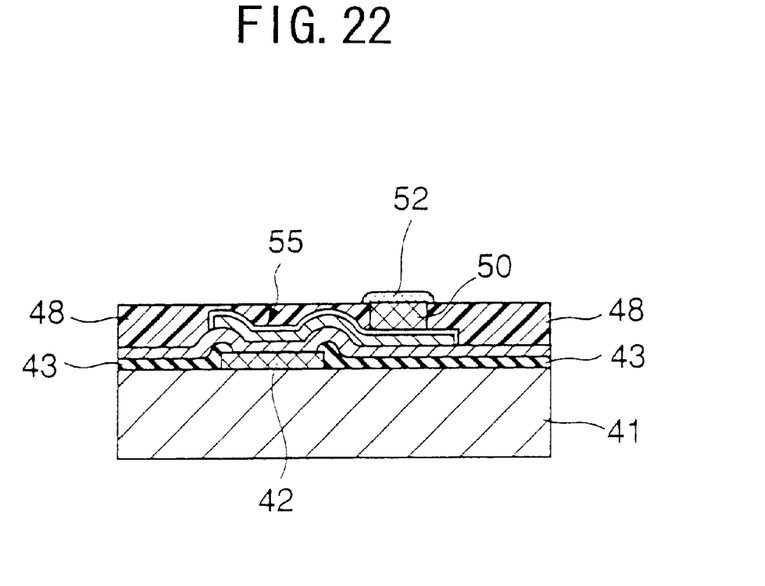
FIG. 22 is an eighth illustration for explaining the method of forming the wiring according to the embodiment of the present invention.
Figure 23:
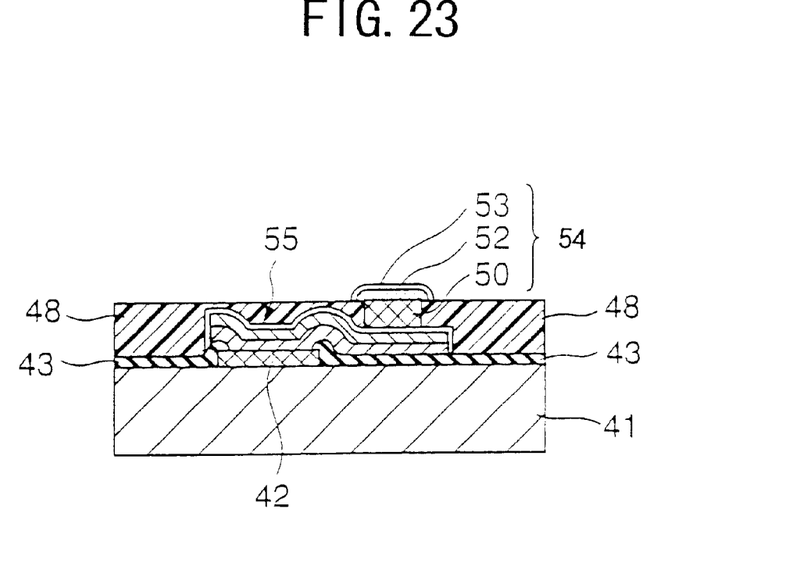
FIG. 23 is a ninth illustration for explaining the method of forming the wiring according to the embodiment of the present invention.

After the post 50 is formed as described above, a second Ni film 52 is formed over the post 50, as shown in FIG. 22. The second Ni film 52 functions as a barrier metal against a solder bump 57. Subsequently, an Au film 53 is formed on the second Ni film 52, as shown in FIG. 23. The Au film 53 functions as an oxidation inhibiting film. The second Ni film 52 and the Au film 53 can be formed also by electroless plating using a commercial electroless plating solution.

In these steps, the second Ni film 52 is formed approximately from 1 μm to 5 μm in thickness, and the Au film 53 is formed approximately from 10 nm to 200 nm in thickness. In addition, although the electroless plating solution normally has a strong alkalinity, the present embodiment selects an alkali-proof material to form the sealing resin 48, as mentioned above. This prevents the sealing resin 48 from deteriorating in the above-mentioned steps using electroless plating. Thus, the post 50 can surely be formed by electroless plating using the sealing resin 48 as a mask.

The above-described steps shown in FIG. 20 to FIG. 23 form the post terminal 54 comprising the post 50, the second Ni film 52 and the Au film 53. The post terminal 54 is electrically connected to the wiring 55 (and the electrode pad 42). The post terminal 54 in this state can be used as a mounting terminal to be joined to a mounting substrate. In the present embodiment, however, in order to join a mounting terminal more surely to a mounting substrate, the solder bump 57 is provided on the post terminal 54 so as to use the solder bump 57 as a mounting terminal. After the solder bump 57 is provided, the wafer 41 is severed along the above-mentioned dicing lines 58 into each semiconductor element 59 so as to form the semiconductor device 60 shown in FIG. 24.

It should be noted that the sealing resin 48 may be formed not only of a polyimide resin as described as an example in the above-mentioned embodiment, but also of such a resin as a polyolefin, a silicon resin, a benzocyclobutene, or an epoxy resin. These resins can tolerate 12.5 pH at lowest, and thus can undergo the above-mentioned steps using electroless plating.

The present invention is not limited to the specifically disclosed embodiments, and variations and modifications may be made without departing from the scope of the present invention.

The present application is based on Japanese priority application No. 2000-368033 filed on Dec. 19, 2000, the entire contents of which are hereby incorporated by reference.

What is claimed is:

1. A method of manufacturing a semiconductor device, the method comprising the steps of:

forming a wiring layer on an underlying metal film formed on a substrate, the wiring layer being electrically connected to an electrode pad formed on a substrate;

removing a part of the wiring layer so as to form a wiring on the substrate, a part of the underlying metal film being exposed other than a part where the wiring is formed;

removing the exposed part of the underlying metal film by using the wiring as a mask;

forming a barrier metal film on the wiring so as to cover the wiring and the underlying metal film underneath the wiring;

forming a post terminal by electroless plating so that the post terminal is electrically connected to said wiring; and providing a sealing resin so as to cover said substrate except a position at which said post terminal is formed.

2. The method as claimed in claim 1, wherein said step of providing the sealing resin is performed before said step of forming the post terminal, and said step of providing the sealing resin includes forming an opening in said sealing resin so as to form said post terminal in the opening in said step of forming the post terminal.

3. The method as claimed in claim 2, wherein said step of providing the sealing resin includes selecting an alkali-proof material to form said sealing resin.

4. The method as claimed in claim 1, wherein the step of forming the barrier metal film on said wiring is performed after said step of removing the barrier metal film so that said wiring and the barrier metal film underneath the wiring are coated with the baffler metal film, and said step of forming the post terminal and said step of providing the sealing resin are performed after the step of forming the metal film.

5. The method as claimed in claim 4, wherein said wiring is formed of copper (Cu).

6. The method as claimed in claim 1, further comprising the step of forming at least one metal film on said post terminal by electroless plating after said step of forming the post terminal.

* * * * *